United States Patent [19]

Larson

[11] Patent Number: 5,767,704

[45] Date of Patent: Jun. 16, 1998

[54] HIGH FREQUENCY ANALOG SWITCH FOR USE WITH A LASER DIODE

[76] Inventor: Francis Willard Larson, 75 Tierra Madre Rd., Placitas, N. Mex. 87043

[21] Appl. No.: 705,930

[22] Filed: Aug. 30, 1996

[51] Int. Cl.⁶ .............................. H03K 3/42; H01S 3/096
[52] U.S. Cl. .................. 327/109; 327/583; 327/65; 369/116; 372/38; 372/26
[58] Field of Search ..................... 372/38, 26, 29; 369/116; 327/109, 108, 181, 374, 376, 377, 583, 493, 423, 482, 489, 563, 65, 110

[56] References Cited

U.S. PATENT DOCUMENTS

| | | | |
|---|---|---|---|
| 4,647,792 | 3/1987 | Meslener et al. | 372/38 |
| 4,709,370 | 11/1987 | Bednarz et al. | 372/38 |
| 5,015,873 | 5/1991 | Hirayama | 327/109 |
| 5,097,145 | 3/1992 | Hayashi | 327/109 |
| 5,197,059 | 3/1993 | Minami et al. | 369/116 |
| 5,253,198 | 10/1993 | Birge et al. | 369/100 |
| 5,276,671 | 1/1994 | Minami et al. | 369/116 |
| 5,309,461 | 5/1994 | Call et al. | 372/38 |
| 5,438,581 | 8/1995 | Reele | 372/38 |

FOREIGN PATENT DOCUMENTS

| | | | |
|---|---|---|---|
| 57-13790 | 1/1982 | Japan | H01S 3/096 |
| 62-237785 | 10/1987 | Japan | H01S 3/096 |

*Primary Examiner*—Timothy P. Callahan
*Assistant Examiner*—Terry L. Englund
*Attorney, Agent, or Firm*—Andrew A. Abeyta; Kenneth J. Johnson

[57] ABSTRACT

In a laser diode which forms read and write functions upon an electro-optic memory, a drive circuit provides power modulation during the read function and sufficient power to perform a write function. During a read function, transistors connected in an emitter coupled switch pair modulate the power delivered to the laser diode. At the emitters of each transistors are a pair of Schottky diodes which enhance the switching speeds of the transistors. Logic is provided to completely turn on the read switch during the time the write switch is on in order to provide sufficient power to the laser diode in order to perform a write function.

11 Claims, 2 Drawing Sheets

HIGH FREQUENCY ANALOG SWITCH FOR USE WITH A LASER DIODE

The United States Government has acquired certain rights in this invention pursuant to Government Contract No. F33657-81-C-0067, awarded by the Department of the Air Force.

FIELD OF THE INVENTION

The present invention relates to an apparatus for supplying current to a laser diode, and more specifically for an apparatus which while operating on a limited power supply, provides modulating power to the laser diode.

BACKGROUND OF THE INVENTION

Optical disk devices are used for the storage of computer-prepared data and have recognized value in their ability to store large quantities of data. In such optical storage devices, a laser diode is used as a light source when carrying out a read or write (or erase) operation. The media for use in such devices is reactive to bursts of light, such as may be produced by the rapid switching of a laser diode. For example, during the write mode, a laser beam is projected incident to an area of a magnetic film of the electro-optic memory which has been premagnetized, and as a result, the area of the magnetic film is heated. Accordingly, the direction of magnetization therein is inverted as compared to the magnetization of adjacent areas. During an erase mode, the laser beam is projected incident to an area of the magnetic film to heat the area, and the heated area is then magnetized by using an external bias magnetic field. During a read mode, when a laser beam is incident to an area of the magnetic film, the read data is determined by a change in a plane of polarization of a reflected light due to the Kerr effect. The write or erasure modes require a lot of energy because of the need to heat the media. In contrast, during the read mode, the laser diode is driven by a small amount of energy.

A requirement of the read mode is that the laser diode drive power be modulated (chopped) at about at about 300 Mhz, which occurs when the laser diode is turned on and off at a 50% duty cycle. The modulation of the power is required to prevent the laser diode from mode hopping while reading from the magneto-optic memory. Mode hopping occurs when the laser diode is driven with a constant current. It is manifested as a random changing of the laser diode's optical power amplitude. The changing amplitude causes a corresponding change in the amplitude of the data being read thus reducing the read channel performance.

In addition to the modulation with a 50% duty cycle, the laser diode power needs to be turned off periodically whenever a write pulse is generated. The read modulated current has to be turned off during the write pulse period because the sum of the required average read power and the required peak write power could overstress the laser diode.

Prior approaches to solving this problem in magneto-optical memories use free-running oscillator circuits with outputs that are capacitively coupled to the laser diode. This approach requires a direct current source to be connected to the laser diode such that the sum of the capacitively coupled current and the direct current passing through the laser diode satisfy the system read power requirement. For 100% modulation, the direct current must equal the average modulated current. These circuits can not be gated on and off quickly due to the energy stored in the coupling element. The application of these circuits also allows the modulated read power to be superimposed upon the write pulses. This is acceptable if the sum of the average read power and the write pulse power do not exceed the power rating of the laser diode. (The write pulse will have superimposed read pulses whose amplitude is twice the average for a 50% duty cycle. Thus the peak write power level will be the average write pulse amplitude plus one-half of the peak to peak read signal amplitude.)

An object of the present invention is to provide a solution to the above described problem which uses standard off-the-shelf parts, instead of custom integrated circuitry with very high bandwidths.

SUMMARY OF THE INVENTION

The present invention discloses a low power drive circuit for a laser diode which provides fast switching. The drive circuit must modulate power during a low power mode, and provides sufficient power during a short high power mode, all while working on a reduced power budget. A voltage source is provided for driving the laser diode. Current through the laser diode is kept at a minimum lasing threshold by the laser diode current source. A read switch initiates a read function for the laser diode and a write switch initiates a write function. The read switch is comprised of first and second transistors with gates which receive an oscillating signal from a remote oscillator. The oscillating signal received by the first transistor is the polar opposite of the signal received by the second transistor so that the two transistors switch on and off in an alternating fashion. In electrical connection with the emitter of each transistor is the anode of a Schottky diode. The cathodes of the Schottky diodes are connected to a current source for the read switch. Also included is a write switch, which when activated, turns off the read switch and draws sufficient current through the laser diode to perform a write function.

The Schottky diodes of the read switch allow for a higher switching speed for a given transistor bandwidth. The Schottky diodes block the path back through the transistor which is currently off and allows only the current source current to be switched. The switching on and off of the first and second transistors provides the proper oscillating current to properly drive the laser during the read mode an avoid any mode hopping.

DESCRIPTION OF THE PREFERRED EMBODIMENT

Figure 1:
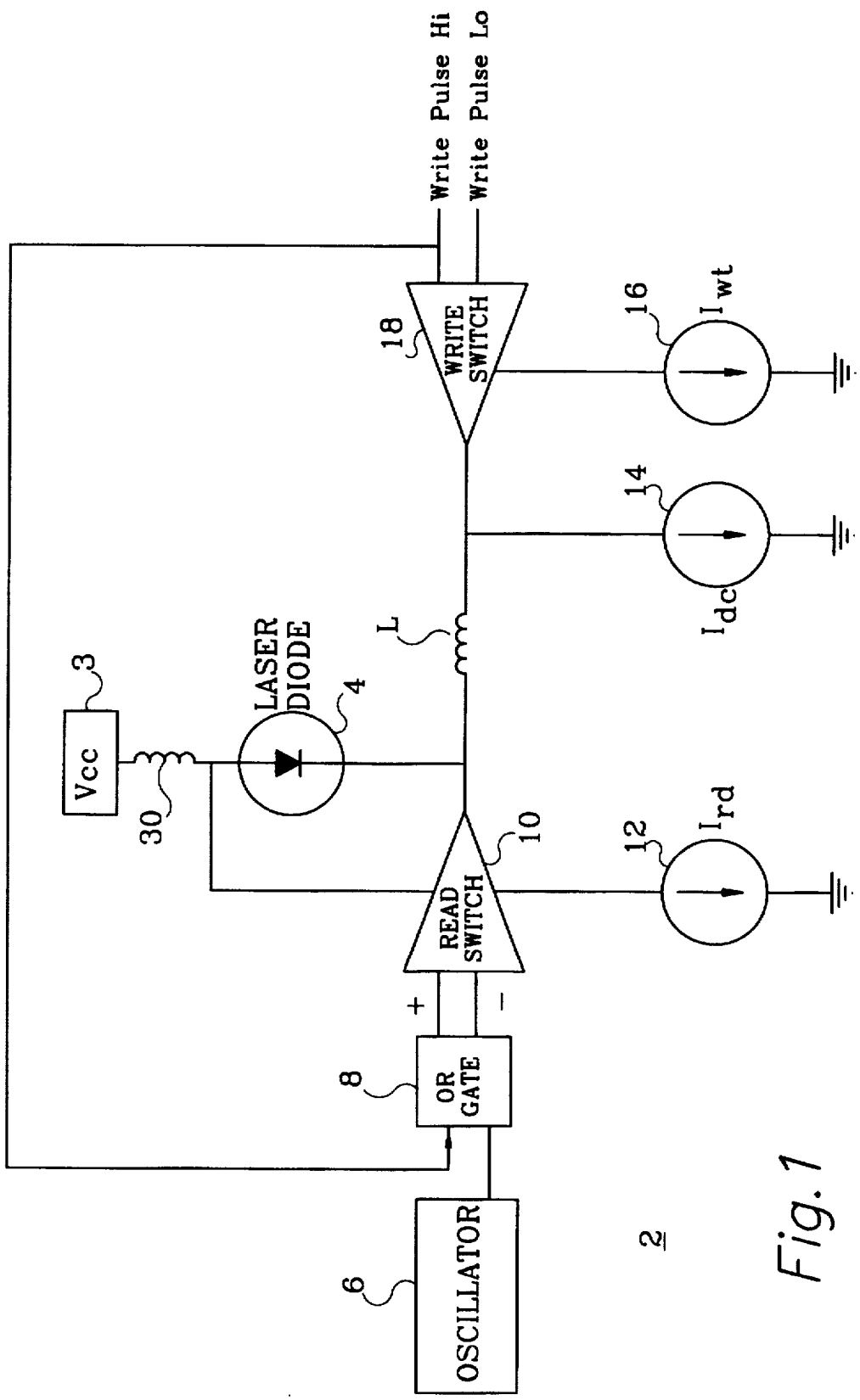
FIG. 1 is a block diagram of the laser diode driving system.

Disclosed in FIG. 1 is a block diagram of the laser diode driving system 2. In this system, the laser diode 4 provides the necessary light in order to read from an electro-optic memory or write upon it. The preferred embodiment of the invention describes the laser diode drive circuits as part of a system which reads and writes upon an electro-optic memory. It is apparent to one skilled in the art that this circuit can be used to drive a laser diode in any application.

The laser diode is connected to a voltage source 3 which is commonly +5 volts. Current through the laser diode 4 is drawn by threshold current source 14 which, during the operation of the laser, holds the laser diode at a threshold just below the lasing point. Also included in the system are read switch 10 and write switch 18. The read switch along with read current source 12 provides sufficient current through the laser diode 4 in order to perform a read operation upon the electro-optic medium. The write switch 18 along with write current source 16, provides sufficient current through the laser diode 4 in order to perform a write function upon the electro-optic memory.

Also in direct and indirect connection with the read switch 10 are oscillator circuit 6 as well as OR gate 8. The oscillator 6 provides an oscillating signal to read switch 10. The OR gate 8 provides the logic in order to switch off the read switch when the write switch is in operations and vice versa.

Also in electrical connection with the read switch 10 and write switch 18 is an isolating inductor L connected between the read switch 10 and the write switch 18 as shown in FIG. 1. The inductor L isolates the write switch 18 from the read switch 10. Inductor L provides a high-impedance connection to the write switch 18 at the high frequency at which the read switch 10 operates; inductor L eliminates the loading effect of the write switch 18 on the read switch 10. If inductor L is omitted from the laser diode driving system 2, then the laser diode driving system 2 would not operate as intended. More specifically, if the inductor L were omitted, then there would be a short circuit effect between read switch 10 and write switch 18 as can be seen upon inspection of FIG. 1. Thus, inductor L isolates the read switch 10 from the write switch 18.

In operation, before either a read or write function is performed, a threshold current is drawn through the laser diode 4 by the threshold current source 14 in order to bring the laser up to the lasing point. When a read function is performed, an oscillating signal from oscillator 6 is transmitted through OR gate 8 and the read switch is activated. With the combination of laser diode current source 14 and read current source 12, sufficient current is drawn through the laser diode 4 in order to perform the read function. The oscillating signal allows the read switch to modulate the power through the laser diode so as to avoid any mode hopping. During the time when a write function is performed, a write high pulse activates the write switch 18, and through OR gate 8, also activates the read switch 10. The write switch connects current source 16 to the laser diode in combination with the peak read current and draws sufficient current for a short amount of time in order to perform the write function. Typically a write pulse period is about 50 nsec long and occurs at 150 nsec intervals.

In order for the present system, and in particular the laser diode to operate properly, the read switch must modulate the power in a quick and sharp manner. This requires a very high speed gated switch. An additional requirement because of the possible power limitations of the laser diode, is that the read power modulation must be gated out during the write power pulse time interval. In order to provide these features, the design of the read switch is critical.

Figure 2:
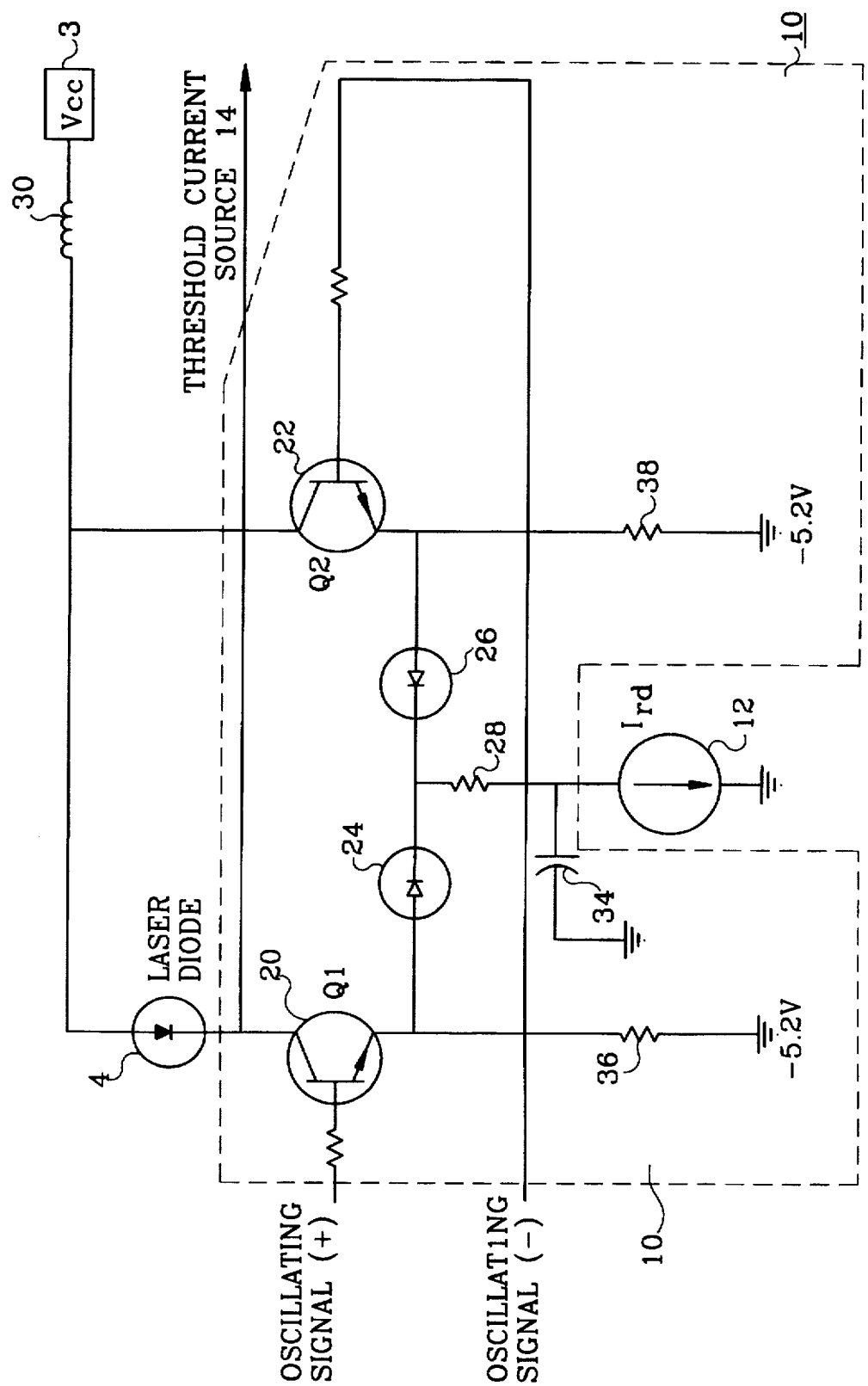
FIG. 2 is a circuit diagram for the read switch.

The configuration for the read switch 10 is shown in detail in FIG. 2. The switch includes transistors 20 and 22 connected in an emitter coupled switch pair. Electrically connected at the collector of transistor 20 is the cathode of laser diode 4. Electrically connected to the collector of transistor 22 is the anode of laser diode 4. Read switch 10 receives the oscillating signals from the oscillator 6 through OR gate 8 and through electrical connections in a manner well known to those skilled in the art. The electrical connection of the oscillating signals to read switch 10 is illustrated in FIG. 2. The base of both transistors 20 and 22 receive the oscillating signal transmitted by the oscillating circuit 6. A Schottky diode 24 has its anode in electrical connection with the emitter of transistor 20 while its cathode is in connection, through resistor 28, with the read current source 12. A second Schottky diode 26 has its anode in electrical connection with the emitter of transistor 22 while its cathode is in electrical connection with the read current source 12. The cathodes of Schottky diodes 24 and 26 are electrically connected to read current source 12 through resistor 28.

When the read switch is in operation, oscillating signals are received at the bases of both transistors 20 and 22. Because each transistor receives the polar opposite of the signal received by the other transistor, one transistor is turned on while the other is turned off. The switching of the transistors is controlled at a frequency determined by the frequency of the oscillating signal. When transistor 20 is turned on, a current is drawn through the laser diode via current source 12. When transistor 22 is turned on, the polarity of the current across the diode is reversed. By modulating this power, mode hopping of the laser is avoided which manifests itself as a random changing of the laser diode's optical power amplitude. The changing amplitude causes a corresponding change in the amplitude of the data being read, thus reducing the read channel performance.

The solution disclosed in FIG. 2 requires a very high speed gated switch that will modulate the read power and then gate out this modulation during the write power pulse time interval. An RF transistor functioning in a "standard" emitter coupled switch pair circuit topology that both met the switching speed and current amplitude requirements could not initially be found. While it may have been possible to achieve the required performance with multiple, parallel 10 GHz transistors, this would have taken custom packaging and/or custom integrated circuits. The goal of the design of the present switch was to use a circuit topology that could use a lower performance transistor. A major problem with the large geometry transistor necessary to support 150 mA of collector current operating in an emitter coupled switch pair is its base emitter capacitance. The purpose of the switch pair is to switch the constant current source to the laser diode. The large emitter to base capacitance of such a transistor provides a relatively low impedance path for switching currents from the on transistor to flow directly to the off-transistor's input. This prevents a controlled switching of the current source current since the shunting current is added to the current source's current. Also, the relatively large voltage swing at the transistors bases that is required to complete current switching, increases the current shunting effect and also presents a large load to the driving circuits.

The solution to the above problems is to place Schottky diodes in series with the emitters of the differential pair. The Schottky diodes block the path back through the off transistor and allow only the current source current to be switched, as the path back through the off-transistor is blocked. To further enhance the switching speed performance, a DC current is added to the transistor's emitters to significantly reduce the base to emitter voltage swing while the Schottky diodes are switching. The 10 mA DC current reduces the change in base to emitter voltage to about 70 mV instead of the 800 mV presented by the switch driver to fully turn on/off the emitter coupled switches. As a result, the on-transistor's base drive voltage swing of 800 mV results in an emitter voltage change of about 730 mV, ensuring the Schottky diodes are fully switched. The 10 mA DC current added to the switched current is acceptable since the laser diode has a lasing threshold current of about 50 mA. As shown in FIG. 1, a separate DC current, i.e., threshold current source 14, source is summed into the laser diode. The read switch's DC current is added to this DC current source to bring the laser diode current near its lasing threshold. The total DC current could be routed through the switching transistor to further reduce the base to emitter voltage change during switching, but this would cause other problems. These problems include increased requirements for the transistor's collector current amplitude power dissipation and base drive.

The RF transistor chosen has a minimum bandwidth of 1.2 GHz and can support the 150 mA collector current. This transistor will perform adequately in the circuit topology described but is inadequate in a standard emitter coupled switch configuration without the Schottky diodes and the DC current path. The Schottky diodes chosen have a reverse recovery time of about 100 psec and a junction capacitance of less than 1 pF.

A more typical differential switch would have the transistor emitters directly connected to each other. This topology would not allow a direct current path as the transistors would be completely turned on and off with the 800 millivolt input signal. By inserting the Schottky diodes between the two emitters, a direct current path can be connected to the emitters. The resistors 36 and 38 connected between the emitters and −5.2 volts provide the direct current. With this circuit topology, the transistors will conduct both the direct current component and the controlled amplitude (modulated) current from the current source (through the Schottky diodes). The direct current must be equal to or less than the laser diode threshold value to achieve 100% modulation. The average of the modulated current and the direct current must provide sufficient current to produce the needed optical power. Transistor speed enhancement occurs because the base to emitter voltage becomes relatively small since the ratio of on to off current will be about ten (10) to one with 100 mA of modulated current and 10 mA of direct current. This means the transistor base to emitter voltage will not change more than about 70 millivolts and the resulting drive required to charge and discharge the base to emitter capacitance component will be minimized. An alternate view is that given an input drive current, the switching speed will be greater than with a circuit that has the full 800 millivolt change across the base to emitter. Thus the transistor base voltage will change the full 800 millivolts but the emitter will also change by about 730 millivolts so the base to emitter voltage will only change by 70 millivolts. It may be noted that a direct emitter to emitter connected differential switch could be driven with just a 70 millivolt amplitude input signal to achieve the same level of direct and modulated current switching. However, this would be extremely difficult to control and would depend upon several transistor parameters that would have to be screened (100% testing) to achieve adequate performance. In addition, the input drive voltage level and impedance would also have to be very precisely controlled. This circuit using the Schottky diodes does not have any of these control requirements as the current levels determine the base to emitter voltage changes during switching and no special transistor or input drive parameters are required.

The inductor 30 in series with the laser diode anode and +5 volts also acts to improve the switch speed and balance the current between the two transistor collectors. Because the collector current is always flowing through the inductor 30, and either the laser diode during the on time or through transistor Q2 during the off time, the commutation (time during which the current is switched) effects are minimized. During the off time, the inductor charges to the full current level. This current tries to maintain its value during the switching time as Q2 turns off and Q1 turns on by causing the voltage at the laser diode anode to increase. This increase voltage acts to speed up the laser diode turn on time in two ways. First the increasing voltage causes the laser diode inductance to increase its current. Second the increase in voltage at the laser diode anode will translate to the collector of Q1 reducing the capacitance multiplication effect (Miller effect). This effectively reduces the input base drive current required to charge the transistor base to collector capacitance. Thus the series inductor both increases switching speed and maintains a pulse to pulse balance of current between the two switching transistors.

The resistor 28 and capacitor 34 connected between the cathodes of the Schottky diodes and the current source provide two functions. First, they provide a long term balancing effect due to the time constant (RC) being relatively long (compared to the 300 MHz switching rate). This is needed because the current source is controlled by current in the laser diode and this current only passes through Q1. Thus there is a possibility that the current through Q1 could become significantly less than the current through Q2 and the closed loop control would not know the difference since laser diode power was correct. However, for this to occur, the voltage drop across Q2 base to emitter and the Schottky diode on the Q2 side would be greater than the corresponding voltage drops on Q1's side of the differential switch. The capacitor acts to integrate (average) the voltage at the Schottky diode's cathode and thus prevent the pulse to pulse voltage variations from occurring. Second, they also ensure that the Schottky diodes are fully switched from on to off during each pulse since the equivalent source impedance to the resistor and capacitor node is relatively low. Thus a low impedance to a stable voltage allows for more responsive diode switching. Note that the average current will still be determined by the current source so control is not diminished by the RC combination.

The requirement for off-the-shelf parts led to the use of an RF transistor in a TO-39 package (2N5109). This transistor has a minimum gain bandwidth of 1.2 gigahertz. It also meets the requirement of 150 mA of collector current without excessive power dissipation or bandwidth degradation. The output power rise time is significantly less than 1 nanosecond and the fall time is about 1.5 nanoseconds. This is adequate to achieve the 100% modulation of the laser diode output power.

The foregoing is a novel and non-obvious high frequency laser diode drive switch for use in a magneto-optic memory. The Applicant does not intend to limit the invention through the foregoing description, but instead define the invention through the claims appended hereto

I claim:

1. A drive circuit which provides modulating current to a laser diode the laser diode having an anode and a cathode the drive circuit comprising:

a read drive circuit comprising:

a first transistor with a base, a collector, and an emitter, where the base of the first transistor receives a first oscillating signal and the collector of the first transistor is in electrical connection with the cathode of the laser diode;

a second transistor with a base, a collector, and an emitter, where the base of the second transistor receives a second oscillating signal and the collector of the second transistor is in electrical connection with the anode of the laser diode;

a first Schottky diode with an anode and a cathode, where the anode of the first Schottky diode is in electrical connection with the emitter of the first transistor;

a second Schottky diode with an anode and a cathode, where the anode of the second Schottky diode is in electrical connection with the emitter of the second transistor, a resistive element in electrical connection with the cathodes of the first and second Schottky diodes; and a capacitive element in electrical connection with the resistive element and with ground;

a voltage source in electrical connection with the anode of the laser diode and the collector of the second transistor;

an inductor in electrical connection with the anode of the laser diode and the collector of the second transistor, the inductor being electrically connected in series with the voltage source; and a read current source in electrical connection, through the resistive elements with the cathode of the first Schottky diode and the cathode of the second Schottky diode.

2. The drive circuit of claim 1 wherein the drive circuit is reading from a memory in an electro-optic memory system.

3. The drive circuit of claim 1 wherein the first and second transistors are of the lower bandwidth discrete RF type.

4. The drive circuit of claim 1 wherein the first and second transistors have a minimum bandwidth of 1.2 GHz.

5. The drive circuit of claim 2 further including a write switch with a write current source which, when activated and the read drive circuit is also activated, draws sufficient current through the laser diode to perform a write function on the electro-optic memory.

6. The drive circuit of claim 5 wherein write periods for the write switch occur for 50 ns periods.

7. A drive circuit for a laser diode the laser diode having a cathode and an anode, the drive circuit comprising:

a voltage source for driving the laser diode;

an oscillating signal means which outputs first and second oscillating signals where the second oscillating signal is the polar opposite of the first oscillating signal;

a read switch which provides a first current to the laser diode to perform a read function, said read switch comprising:

a first transistor with a base, a collector, and an emitter, where the base of the first transistor receives the first oscillating signal and the collector of the first transistor is in electrical connection with the cathode of the laser diode;

a second transistor with a base, a collector, and an emitter, where the base of the second transistor receives the second oscillating signal and the collector of the second transistor is in electrical connection with the anode of the laser diode;

a first Schottky diode with an anode and a cathode, where the anode of the first Schottky diode is in electrical connection with the emitter of the first transistor;

a second Schottky diode with an anode and a cathode, where the anode of the second Schottky diode is in electrical connection with the emitter of the second transistor;

a resistive element in electrical connection with the cathodes of the first and second Schottky diodes, and a capacitive element in electrical connection with the resistive element and with ground;

an inductor in electrical connection with the anode of the laser diode and the collector of the second transistor, the inductor being electrically connected in series with the voltage source, a read current source in electrical connection, through the resistive element with the cathode of the first Schottky diode and the cathode of the second Schottky diode;

a threshold current source in electrical contact with the cathode of the laser diode to keep a minimum current flowing through the laser diode; and a write switch with a write current source which when activated and the read switch is also activated, draws sufficient current through the laser diode to perform a write function.

8. The drive circuit for a laser diode of claim 7 wherein a first current source is connected to the emitter of the first transistor and a second current source is connected to the emitter of the second transistor.

9. The drive circuit for a laser diode of claim 7 wherein the first and second transistors are of the lower bandwidth discrete RF type.

10. The drive circuit for a laser diode of claim 7 wherein the first and second transistors have a minimum bandwidth of 1.2 GHz.

11. The drive circuit for a laser diode of claim 7 wherein write periods occur for 50 ns periods.

* * * * *